United States Patent
Shi et al.

(10) Patent No.: US 10,650,179 B2
(45) Date of Patent: May 12, 2020

(54) METHOD AND SYSTEM FOR FORMALLY ANALYZING THE MOTION PLANNING OF A ROBOTIC ARM BASED ON CONFORMAL GEOMETRIC ALGEBRA

(71) Applicant: Capital Normal University, Beijing (CN)

(72) Inventors: Zhiping Shi, Beijing (CN); Sha Ma, Beijing (CN); Yong Guan, Beijing (CN); Zhenzhou Shao, Beijing (CN); Qianying Zhang, Beijing (CN); Rui Wang, Beijing (CN); Xiaojuan Li, Beijing (CN); Liming Li, Beijing (CN)

(73) Assignee: Capital Normal University, Beijing (CN)

( * ) Notice: Subject to any disclaimer, the term of this patent is extended or adjusted under 35 U.S.C. 154(b) by 57 days.

(21) Appl. No.: 15/780,138

(22) PCT Filed: Jan. 23, 2017

(86) PCT No.: PCT/CN2017/072210
§ 371 (c)(1),
(2) Date: May 30, 2018

(87) PCT Pub. No.: WO2017/129093
PCT Pub. Date: Aug. 3, 2017

(65) Prior Publication Data
US 2018/0365349 A1  Dec. 20, 2018

(30) Foreign Application Priority Data

Jan. 27, 2016 (CN) .......................... 2016 1 0055938

(51) Int. Cl.
G05B 15/00 (2006.01)
G05B 19/00 (2006.01)
(Continued)

(52) U.S. Cl.
CPC ........ *G06F 30/3323* (2020.01); *B25J 9/1602* (2013.01); *B25J 9/1605* (2013.01);
(Continued)

(58) Field of Classification Search
CPC .... B25J 19/0029; B25J 9/1602; B25J 9/1605; B25J 9/1664; B25J 9/1682;
(Continued)

(56) References Cited

U.S. PATENT DOCUMENTS

| 10,001,780 B2* | 6/2018 | Gabardos et al. |
| 10,274,325 B2* | 4/2019 | Rombouts et al. |
| 2014/0277741 A1* | 9/2014 | Kwon .................... B25J 9/1689 700/263 |

FOREIGN PATENT DOCUMENTS

| CN | 101244561 A | 8/2008 |
| CN | 103901898 A | 7/2014 |

(Continued)

OTHER PUBLICATIONS

International Search Report for International Application No. PCT/CN2017/072210 dated May 4, 2017.
(Continued)

*Primary Examiner* — Harry Y Oh
(74) *Attorney, Agent, or Firm* — Clements Bernard Walker

(57) ABSTRACT

Method and system for formally analyzing motion planning of a robotic arm based on conformal geometric algebra. The method includes determining specific structural and motion planning parameters of a robot, establishing a corresponding geometric model for the basic components and motion planning constraints of the robot based on a conformal geometric algebra theory, the established geometric model being described in a higher-order logic language, performing formal modeling for a motion process of the robot based
(Continued)

on the established geometric model to obtain a logic model of the geometric relations involved in the motion process of the robot, obtaining a motion logic relationship corresponding to a constraint or attribute of a motion process to be verified of the robot, and verifying whether the motion logic relationship is correct. The method and system are used for analysis to improve the accuracy of the verification and reduce the complexity of the computations.

20 Claims, 3 Drawing Sheets

(51) Int. Cl.
*G06F 30/3323* (2020.01)
*B25J 9/16* (2006.01)
*B25J 19/00* (2006.01)

(52) U.S. Cl.
CPC .......... *B25J 9/1664* (2013.01); *B25J 9/1682* (2013.01); *B25J 19/0029* (2013.01); *G05B 2219/39079* (2013.01); *G05B 2219/40371* (2013.01); *G05B 2219/40519* (2013.01)

(58) Field of Classification Search
CPC .......... G05B 2219/39079; G05B 2219/40371; G05B 2219/40519; G06F 17/504
See application file for complete search history.

(56) References Cited

FOREIGN PATENT DOCUMENTS

| CN | 104772773 A | 7/2015 |
|----|-------------|--------|
| CN | 105760576 A | 7/2016 |

OTHER PUBLICATIONS

Li, Qicai, "Kinematics Study of Reconfigurable Robot Based on Conformal Geometric Algebra", Electronic Technology & Information Science, China Master's Theses Full-Text Database, Aug. 15, 2015, No. 8, pp. 1,8 and 9.

* cited by examiner

METHOD AND SYSTEM FOR FORMALLY ANALYZING THE MOTION PLANNING OF A ROBOTIC ARM BASED ON CONFORMAL GEOMETRIC ALGEBRA

The present application claims priority to Chinese Patent Application No. 201610055938.2, filed with the State Intellectual Property Office of the People's Republic of China on Jan. 27, 2016 and entitled "Method and System for Formally Analyzing the Motion Planning of a Robotic Arm based on Conformal Geometric Algebra," which is included here in its entirety.

TECHNICAL FIELD

The present application relates to the technical field of computer science, and specifically to a method and system for formally analyzing the motion planning of a robotic arm based on conformal geometric algebra.

BACKGROUND

Conformal Geometric Algebra (CGA), as an advanced geometric representation and computing system, provides a concise, intuitive, and unified homogeneous algebraic framework for classical geometry. CGA represents the reference origin ($e_0$) and a point at infinity ($e_\infty$) by adding two dimensions, so that the Euclidean space is embedded into a conformal space, and gives it the structure of a Minkowski inner product, not only preserving the Grassmann structure of an outer product in homogeneous space, but also making the inner product possess a definite geometric meaning characterizing the basic metric of the distance, angle, and so on. CGA not only succeeds in solving the problem of how to accomplish geometric computations with geometric language, but also plays a key role in solving geometric problems in many high-technology fields, such as engineering and computer science. In robotics, CGA is different from the previously used algebra in that an object involved in its computation is a geometry instead of a number. The object in robot research is a geometric relation formed by a system established based on a basic geometry. Therefore, conformal geometric algebra is unique in robot research.

At present, modeling, computation and analysis are performed using CGA as a mathematical tool. In this process, computer-based numerical computation and analysis and computer algebra systems (CASs) (e.g., Maple, CLUCaic, Gaalop, etc.) are usually used. However, neither of these two methods can completely ensure the correctness and accuracy of the results. Because the number of iterations needed in the computation is limited by the computer memory and floating point numbers, numerical computation and analysis cannot completely ensure the accuracy of the results. However, although the symbolic method provided by CASs can accurately deduce the solution to a symbolic expression using a core algorithm, the algorithm for computing an enormous set of symbols has yet to be verified and there is a shortcoming in the processing of boundary conditions. Thus, the results that are obtained may still be problematic.

In recent decades, formal methods are widely used in many fields. With the development of basic research and the promotion of technological progress, new methods and new tools are continuously emerging, and have gradually improved into mature and highly reliable verification technologies. The main idea behind such technologies is to prove, based on mathematical theory, that the system that has been designed meets the system specifications or has the desired properties. Compared with a pen and paper-based manual analysis and the above traditional methods, formal methods can increase the chances of finding small but crucial errors in early designs, according to the stringency of mathematical logic.

The problems mentioned earlier arise when modeling, computation, and analysis are performed using CGA as a mathematical tool. A formal analysis of CGA theory is an ideal way to prevent such problems. Because CGA is unique in robot research, how to combine CGA with a formal way is an urgent technical problem that needs to be solved in robot research.

SUMMARY

Thus, the purpose of the present application is to provide a method and system for formally analyzing the motion planning of a robotic arm based on conformal geometric algebra, in order to solve the problems of complex computations and inaccurate results in the prior art when analyzing the motion planning of a robotic arm.

One aspect of the present application concerns the provision of a method for formally analyzing the motion planning of a robotic arm based on conformal geometric algebra, which includes:

determining the specific structural parameters and motion planning parameters of a robot;

establishing a corresponding geometric model for the basic components and motion planning constraints of the robot according to the specific structural parameters and the motion planning parameters based on a conformal geometric algebra theory, wherein the established geometric model is described in a higher-order logic language; performing formal modeling for a motion process of the robot based on the established geometric model, to obtain a logical model of the geometric relations involved in the motion process of the robot;

obtaining a logical relationship about motion corresponding to a constraint or attribute of a motion process to be verified of the robot, using the above model;

verifying whether the logical relationship about motion is correct; if it is correct, this indicates that the logical model of the geometric relations meets the constraint of the motion process to be verified or has the attribute of the motion process to be verified; otherwise, it is indicated that the logical model of the geometric relations does not meet the constraint of the motion process to be verified or does not have the attribute of the motion process to be verified.

Another aspect of the present application is the provision of a system for formally analyzing the motion planning of a robotic arm based on conformal geometric algebra, which includes:

a parameter determining module, configured for determining the specific structural parameters and motion planning parameters of a robot;

a module for the establishing of robot basic geometric logical models, configured for establishing a corresponding geometric model for the basic components and motion planning constraints of the robot according to the specific structural parameters and the motion planning parameters based on a conformal geometric algebra theory, wherein the established geometric model is described in a higher-order logic language;

a module for the establishing of a logical model of the geometric relations in the motion process of the robot, configured for performing formal modeling for a motion process of the robot based on the established geometric model, to obtain a logical model of the geometric relations in the motion process of the robot;

a module for the construction of logical propositions, configured for obtaining a motion logic relationship corresponding to a constraint or attribute of a motion process to be verified of the robot, using the logical model of geometric relations;

a verification module, configured for verifying whether the motion logic relationship is correct; if the motion logic relationship is correct, this indicates that the logical model of geometric relations meets the constraint of the motion process to be verified or has the attribute of the motion process to be verified, or if the motion logic relationship is not correct, this indicates that the logical model of geometric relations does not meet the constraint of the motion process to be verified or does not have the attribute of the motion process to be verified.

Another aspect of the present application is the provision of a storage medium. The storage medium is configured for storing executable program code which, when executed, performs the above method for formally analyzing the motion planning of a robotic arm based on conformal geometric algebra.

Another aspect of the present application is the provision of an application program. When executed, the program performs the above method for formally analyzing the motion planning of a robotic arm based on conformal geometric algebra.

Another aspect is the provision of an electronic device, which includes:

a processor, a memory, a communication interface, and a bus, wherein the processor, the memory, and the communication interface are connected and communicate with each other through the bus, the memory stores executable program code, the processor executes a program corresponding to the executable program code by reading the executable program code stored in the memory, to perform the above method for formally analyzing the motion planning of a robotic arm based on conformal geometric algebra.

Unlike the traditional method, in the technical solutions provided in the above embodiment, after a logical model of geometric relations is obtained by performing the modeling in a formal way, a motion logic relationship corresponding to a constraint or attribute of a motion process to be verified is obtained according to the model, and whether the above motion logic relationship is correct is verified. The above method is accurate and complete for the nature of the verification, since correctness is verified using mathematical methods. In addition, CGA can perform the modeling and processing on geometric elements such as points, lines, planes, circles, and spheres, and the rotation and translation of these geometric elements in a unified manner. It offers great advantages in dealing with problems of robot kinematics and motion planning, and can improve dimensions for solving problems, thus simplifying the coupling in robot computations, thereby reducing the complexity of the computations. In view of the above two aspects, when the technical solutions provided by the above embodiments are applied to analyze the motion planning of a robotic arm, the complexity of the computations can be reduced while the accuracy of the verification is improved. Thus, the respective advantages of CGA and formal methods are gained at the same time, and the synergy of both is exploited.

BRIEF DESCRIPTION OF THE DRAWINGS

In order to more clearly describe the embodiments of the present application and the technical solutions in the prior art, drawings that need to be used in embodiments and the prior art will be briefly described below. Obviously, the drawings provided below are for only some embodiments of the present application; those skilled in the art can also obtain other drawings based on these drawings without any creative efforts.

DETAILED DESCRIPTION

Figure 1:
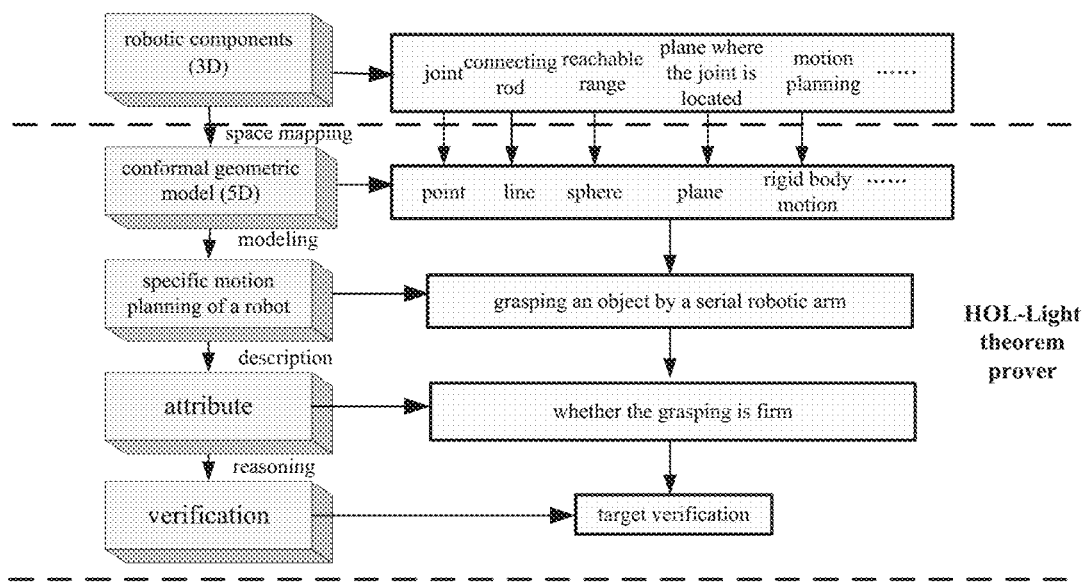
FIG. 1 is a flowchart of the formal modeling of the grasping of an object by a robot, based on CGA in the present application.

In order to make the objectives, technical solutions, and advantages of the present application clearer and more understandable, the present application will be described in more detail below with reference to the appended drawings and embodiments. Obviously, the described embodiments are only some, and not all, of the embodiments of the present application. All other embodiments obtained based on the embodiments of the present application by those skilled in the art without any creative efforts fall into the scope of protection defined by the present application.

Various embodiments of the present application will be described below in more detail with reference to the drawings. In the drawings, the same elements are denoted by identical or similar reference numbers. For the sake of clarity, various parts of the drawings are not drawn to scale.

The currently developed conformal geometric algebra system can theoretically be extended to any dimensional space, and is mainly applied to the 5-dimensional conformal space. The conformal geometric algebra provides a Grassmann structure representing a geometry, a unified effect representing the geometric transformation, and a bracket system and an invariant system representing geometric invariants. It demonstrates significant advantages in the aspects of geometric data processing and geometric computing. Under the framework of geometric algebra, different transformation representation and computation forms have uniformity. After a geometric space transformation, the geometric meanings and geometric characteristics of the original geometric object can still be maintained. The object of robot research is a geometric relation formed by a system established based on a basic geometry. Different from the previous algebra, the computational object of conformal geometric algebra is a geometry rather than a number. Therefore, conformal geometric algebra is unique in robot research. Conformal geometric algebra can also be used to collectively construct traditional methods of robot research, such as Lie Group and Lie algebra, the Wu method, Clifford algebra, and Spin vectors, to be applied to the analysis and synthesis of the mechanism, which promotes the development of mechanisms, forms a universal theoretical method, and reduces the complexity of modeling and deduction computing in mechanisms. Various geometric elements in a space can be expressed as spherical coordinates by extending the dimension, and a relatively simple mathematical model can be obtained in the modeling of a complex multi-degree-of-freedom parallel mechanism.

Under the CGA framework, geometric representation and construction can be performed based on an inner product and an outer product, respectively. The geometric representation based on an outer product mainly reflects a mutually constructive relationship between the geometries of different levels, while the representation based on an inner product may be used to construct a corresponding parametric equation through metrics characterizing parameters such as a distance, an angle, and the like. For any k-order blade A, the parametric equation based on an outer product is $X \wedge A=0$, and that based on an inner product is $X \cdot A=0$. Representations of both can be converted into each other through a dual operation between the inner and outer products. Table 1 gives the geometric representations established based on an inner product and an outer product. The two representations are respectively referred to in many studies as a standard representation and a direct representation.

TABLE 1

CGA basic geometric representation

| geometry | standard representation | direct representation |
|---|---|---|
| point | $P = x + \frac{1}{2}x^2 e_\infty + e_0$ | |
| sphere | $S = P - \frac{1}{2}r^2 e_\infty$ | $S^* = P_1 \wedge P_2 \wedge P_3 \wedge P_4$ |
| plane | $\pi = n + d e_\infty$ | $\pi^* = P_1 \wedge P_2 \wedge P_3 \wedge e_\infty$ |
| circle | $Z = S_1 \wedge S_2$ | $Z^* = P_1 \wedge P_2 \wedge P_3$ |
| line | $L = \pi_1 \wedge \pi_2$ | $L^* = P_1 \wedge P_2 \wedge e_\infty$ |
| point pair | $P_P = S_1 \wedge S_2 \wedge S_3$ | $P_P^* = P_1 \wedge P_2$ |

In table 1, x, n are marked in hold, and represent vectors in Euclidean three-dimensional space:

$$x = x_1 e_1 + x_2 e_2 + x_3 e_3$$

In addition, $x^2 = x_1^2 + x_2^2 + x_3^2$ in Table 1 is a standard inner product in the Euclidean space, that is, the scalar product, which can be described by the scalar product function in a multidimensional vector library. The $e_1$, $e_2$, and $e_3$ are the unit orthogonal bases in Euclidean three-dimensional space. In the direct representation method, a high-dimensional geometry is established mainly by connecting points {Pi} on the geometry with an outer product "$\wedge$". For example, a sphere can be represented by four points on the sphere. The meaning of the outer product in the standard representation method is different, and indicates an intersection between geometries. For example, a circle can be formed by an intersection of two spheres.

Specifically, an embodiment of the present application provides a method for formally analyzing the motion planning of a robotic arm based on conformal geometric algebra. In this method, the specific structural parameters and motion planning parameters of a robot are first determined. Then, a corresponding geometric model is established for the basic components and motion planning constraints of the robot according to the above specific structural parameters and motion planning parameters, based on conformal geometric algebra theory, wherein the established geometric model is described in a higher-order logic language. Formal modeling is performed for the motion process of the robot based on the established geometric model, to obtain a logical model of the geometric relations involved in the motion process of the robot. Then, a motion logic relationship corresponding to a constraint or attribute of a motion process to be verified of the robot is obtained, using the model. Finally, whether the above motion logic relationship is correct or not is verified. If the motion logic relationship is correct, this indicates that the above logical model of geometric relations meets the constraint of the motion process to be verified or has the attribute of the motion process to be verified. If the motion logic relationship is not correct, this indicates that the above logical model of geometric relations does not meet the constraint of the motion process to be verified or does not have the attribute of the motion process to be verified.

It is worth mentioning that the constraints or attributes of each motion process of the robot to some degree reflect the control and the operations that can be realized, and the control and the operations that cannot be realized of the robot during this motion process, and the like. To this end, it can be considered that the constraints or attributes of each motion process of the robot correspond to a kind of motion logic relationship. In addition, different robots have different geometric features, and different geometric features have an impact on the motion logic relationship. Therefore, the logical model of geometric relations for the robot needs to be used when the motion logic relationship corresponding to the constraint or attribute of each motion process of the robot is determined. For example, two gripper ends of a gripper can be originally opened by 180 degrees, but due to the limitation of the work space, the two gripper ends can only be opened by 120 degrees at a certain position in the space such as a position Q; otherwise, the robot gripper will collide with other objects in the work space. At this time, 120 degrees is a constraint of the robot gripper at the position Q; that is, when the robot gripper moves in the work space, if it moves to the position Q, the degree of the opening between the two gripper ends must be adjusted from 180 degrees to 120 degrees, otherwise a collision event will occur.

Furthermore, from a mathematical point of view, the motion logic relationship corresponding to the constraints or attributes of the motion process to be verified of the robot, which was obtained using the logical model of geometric relations, can be understood as a logical proposition composed of the above model, and the constraints or attributes of the motion process to be verified.

Specifically, a logic reasoning engine can be used to verify whether the above motion logic relationship is correct.

In an implementation of the present application, a higher order logic theorem prover (HOL-Light) can be introduced in the process from formal modeling for the motion process of the robot based on the established geometric model so as to obtain a logical model of geometric relationships involved in the motion process of the robot, to verifying whether the above motion logic relationship is correct by using the above logic reasoning engine. Specifically, a CGA formal model is established using HOL-Light, and formal modeling is performed for the motion process based on the established CGA formal model, to obtain a logical model of geometric relations. Further, formal modeling is performed for constraints or attributes of the motion process to be verified to obtain the above motion logic relationship. Finally, whether the formal model of the above motion logic relationship is correct is verified based on the logic reasoning engine in the CGA formal model.

FIG. 1 is a flow chart of the formal modeling and verification of the grasping of an object by a robot using a CGA-based method proposed in the present application. The main idea in the operating of a robot using this method is the geometric motion transformation representation of CGA.

However, the transformed geometric object in the present application is a reference circle rather than a reference point. The geometric features of a robot gripper and an object that is grasped are indicated by circles. In the present application, the high-order logic theorem prover HOL-Light is used as a formal tool. HOL-Light is one of the most popular theorem provers. Not only is there a large research team and user group on HOL-Light, but also a substantial body of mathematical libraries, such as a real number analysis library, a transcendental function library, an integral-differential library, and a series of efficient proof strategies.

Specifically, the specific structural parameters and the motion planning parameters of robotic components are first determined. The specific structural parameters could be joint parameters, connecting rod parameters, a reachable range, a plane on which a joint is located, and so on. The motion planning parameters could be translation vectors, rotation angles, and others. Then, a corresponding geometric model is established for the robotic components and the motion planning constraints, based on the conformal geometric algebra theory. For example, a point model can be established based on joint information, a line model can be established based on the connecting rod parameters, a sphere model can be established based on the reachable range, a plane model can be established based on the plane on which a joint is located, a rigid body motion model can be established based on the motion planning parameters, and so on. In the grasping of an object by serial robotic arms as the motion process to be verified, constraints, attributes, and other information describing this motion process are determined to be inputs to HOL-Light to verify this motion process. For example, whether the robotic arm securely grasps the object that is grasped is determined through the attribute information of the motion process to be verified, so as to achieve the target verification.

It should be noted that the motion process of the robot includes not only the motion process of the grasping of an object by the robot, but also other motion processes, such as a movement process of the robot's arm and the like. The present application only takes the process of the grasping of an object as an example for illustration, which does not limit the present invention.

As shown in FIG. 1, the present application proposes a method for formally analyzing the motion planning of a robotic arm based on conformal geometric algebra, which includes:

establishing a corresponding geometric model for the basic components and motion planning constraints of a robot based on a conformal geometric algebra theory, describing the established geometric model using a higher-order logic language, and forming a basic geometric logic model system for the robot;

determining the specific structural parameters and motion planning parameters of a robot;

performing formal modeling for a specific motion process of the robot based on the basic geometric logic model system, to obtain a logical model of the geometric relations involved in the motion process of the robot;

describing a constraint or attribute of a motion process of the robot to be verified using a logic formula;

forming a logic proposition using the geometric relationship logic model of the specific motion process of the robot and the constraint or attribute of the motion process to be verified;

verifying whether the logic proposition is correct using a logic reasoning engine; if the logic proposition is correct, this indicates that the model meets the constraint or has the attribute, or if the logic proposition is not correct, this indicates that the model does not meet the constraint or does not have the attribute.

It can be understood by those skilled in the art that the basic components of the robot are generally described by the specific structural parameters of those components, and that the motion planning constraints of the robot are generally described by the motion planning parameters of the motion planning. For this purpose, the above specific structural parameters and motion planning parameters need to be determined first before a geometric model corresponding to the basic components and the motion planning constraints of the robot is established, such that the geometric model corresponding to the basic components and the motion planning constraints can be established more clearly and effectively.

In view of the above, generally the specific structural parameters and motion planning parameters of the robot have been determined when the corresponding geometric model is established.

Conformal geometric algebra theory is the theoretical basis of a method for formally analyzing the motion planning of a robot. The method for formally analyzing the motion planning of a robot may realize the reasoning and calculation of a logic representation and the proving of a formal system for a conformal geometric algebra and method for formally analyzing the motion planning of a robot using the logic reasoning engine, for a general method that can be used to analyze specific problems concerning the robot.

Specifically, after the corresponding geometric model for the basic components and motion planning constraints of a robot is established based on the conformal geometric algebra theory, a plurality of geometric models could be obtained, and there would be an association between these geometric models. Thus, we can understand that these geometric models can form the basic geometric logic model system of a robot. Therefore, the establishment of the logical model of geometric relations in the motion process can subsequently be understood as a modeling processing based on the above basic geometric logical model system.

Those skilled in the art can understand that, from a mathematical point of view, the constraints or attributes of the motion process of the robot can be described through a logical formula, so that the logical relationship contained in the motion process of the robot can be presented more intuitively than before. This approach is also more beneficial than other approaches to obtain the motion logic relationship corresponding to the constraints or attributes of the motion process.

In view of this, in an implementation of the present application, when a motion logic relationship corresponding to the constraints or attributes of the motion process to be verified of the robot is obtained using the logical model of geometric relations, a motion logic relationship corresponding to the constraints or attributes of the motion process to be verified can be obtained using the above logical model of geometric relations. This can be done on the basis of the logical formula corresponding to the constraints or attributes of the motion process to be verified. Alternatively, a logical proposition formed by the above logical model of geometric relations and the constraints or attributes of the motion process to be verified can be obtained by referring to the logical formula corresponding to the constraints or attributes of the motion process to be verified.

Specifically, performing formal modeling for a motion planning process relating to the planning for a specific motion of a robot based on the basic geometric logic model system, includes performing formal modeling for a motion planning process involving the grasping of an object by the robot.

Preferably, in the above process of "determining the specific structural parameters and motion planning parameters of a robot," the specific robot is an n-degree-of-freedom serial robot arm with a T-shaped robot gripper at the end of it.

Preferably, in the above process of "performing formal modeling for a specific motion process of the robot based on the basic geometric logic model system, to obtain a logical model of geometric relations in the specific motion process of the robot", the specific motion planning of the robot is a motion planning process involving the grasping of an object by the robot arm.

Preferably, in the above process of "describing a constraint or attribute of the motion process of the robot to be verified using a logical formula," the attribute of the motion process to be verified of the robot is that the robot gripper successfully and firmly grasps the object.

The established geometric model includes a point model abstracted from a robot joint, a sphere model abstracted from a reachable range of an end of a robot joint, a plane model abstracted from an auxiliary plane on which a robot joint is located, and a line model formed by connecting robot joint points, a geometric intersection model abstracted from the constraint relationship of the basic components of a robot, a geometric pure rotation model abstracted from the rotation motion of the basic components of a robot, a geometric pure translation model abstracted from the translation motion of the basic components of a robot, a geometric rigid body motion model abstracted from the reaching of a desired position by an end of a robot joint, a distance model between geometries abstracted from the metric relationship of the basic components of a robot, and a geometric angle model abstracted from an angle of the basic components of a robot.

The above models are described in detail below. The geometry includes a point, a line, a plane, a circle, a sphere, and a point pair, which are used to represent a basic component of a robot.

The following is the point model abstracted from a robot joint: $S = s + \frac{1}{2}s^2 e_\infty + e_0$ The above model can be formalized in HOL-Light, specifically as follows:

|-•s.point_CGAs=s$1% mbasis{1}+s$2% mbasis{2}+s$3% mbasis{3}+(&1/&2*(s dot s)) % null_inf+null$_+$zero In this model, the robot joint is abstracted into a point, and the above mathematical expression is a standard expression of a point in conformal geometric algebra. The function point_CGA in this model represents the mapping relationship of a point from the three-dimensional Euclidean space to the five-dimensional conformal space.

In the above model expression, $s = s_1 e_1 + s_2 e_2 + s_3 e_3$ represents a point in the three-dimensional Euclidean space, $e_1$, $e_2$ and $e_3$ are unit orthonormal bases in the three-dimensional Euclidean space, $s_1$, $s_2$, and $s_3$ are coefficients, and S is an expression of the point s mapped from the Euclidean space into the conformal space. The input variable of the function point_CGA is a three-dimensional vector in the Euclidean space, and its return value is a multivector in the five-dimensional conformal space. Since the conformal geometric algebra can be constructed from the geometric algebra $Cl_{4,1}$, its data type is defined as a real^(4,1)multivector. s$n represents the nth element of the multidimensional vector s, the mbasis function represents the basic blade function, the dot function represents the scalar product in the Euclidean space, and the null_inf and null_zero functions respectively represent zero vectors $e_0$ and $e_\infty$:

$$e_0 = \frac{1}{2}(e_- - e_+), e_\infty = e_- + e_+,$$

wherein $e_0$ represents an origin point, $e_\infty$ represents a point at infinity, and $e_+$, $e_-$ can be replaced by $e_\infty$, $e_0$ to more compactly represent a point in the conformal space. In the present application, base vectors $e_+$, $e_-$ are defined as mbasis {4} and mbasis {5}, respectively representing the fourth base vector and the fifth base vector in CGA space. The following is a formal definition:

|-null_zero=(&1/&2)%(mbasis{5}−mbasis{4})/\
   null_inf=(mbasis{5})+(mbasis{4})

The function point_CGA in this model represents the mapping relationship of a point from the three-dimensional Euclidean space to the five-dimensional conformal space.

The following is a sphere model abstracted from a reachable range of an end of a robot joint:

$$S = P - \frac{1}{2}r^2 e_\infty.$$

The above model can be formalized in HOL-Light, specifically as follows;

|-∀p r. sphere_CGAp r=point_CGAp−((&1/&2)*(r pow 2))% null_inf

The reachable range of an end of a robot joint is abstracted into a sphere S, whose center is the joint and whose radius is a connecting rod. The above mathematical expression is the standard expression of a sphere in conformal geometric algebra. The input variables p, r of the function sphere_CGA respectively represent the center and the radius, wherein the center can be represented by a three-dimensional vector in the Euclidean space.

The following is a plane model abstracted from an auxiliary plane on which a robot joint is located: $\pi = n + d e_\infty$.

The above model can be formalized in HOL-Light, specifically as follows:

|-∀n d. plane_CGAn d=n$1% mbasis{1}+
   n$2%mbasis{2}+n$3%mbasis{3}+d% null_inf

The auxiliary plane on which a robot joint is located is abstracted into the plane π, and the above mathematical expression is a standard expression of a plane in conformal geometric algebra. The input variables n and d of the function plane_CGA respectively represent the normal vector of the auxiliary plane and the distance of the auxiliary plane to the origin point. The normal vector of the auxiliary plane can be represented by a three-dimensional vector in the Euclidean space.

The following line model is constructed by connecting the robot joints of a robot:

$$L^\circ = A \wedge B \wedge e_\infty.$$

The above model can be formalized in HOL-Light, specifically as follows:

|-∀A B.line_direct_CGAA B=A outer B outer
   null_inf

The above mathematical expression is an expression of a line L* formed by any two points in conformal geometric algebra, which can be used to represent a line constructed by the joint points of a robot or some other auxiliary line, wherein A and B respectively represent two points in the conformal geometric space. The model is used to abstract the connecting rod between two joints into a line. The above expression is a direct expression of a line in conformal geometric algebra. The input variables a and b of the function line_direct_CGA respectively represent two points on the line and the data type is a real^(4,1)multivector, wherein the function outer represents an outer product operation in geometric algebra, and the outer product operation can realize a construction from a low-dimensional geometry to a high-dimensional geometry, that is, a dimension-expanding operation.

The geometric intersection model o is abstracted from a constraint relationship of the basic components of a robot:
$o = o_1 \wedge o_2 \wedge \ldots \wedge o_n$ The above model can be formalized in HOL-Light, specifically as follows:

|-MEET $o_1 o_2 \ldots o_n = o_1$ outer $o_2$ outer $\ldots o_n$ wherein $o_i$ represents a geometry representing the $i^{th}$ basic component of the robot, i=1, 2, ..., n.

The model uses an outer product to realize an intersection operation of geometries representing the basic components of the robot. The input variables of the function MEET represent any geometries on which an intersection is to be performed, and the data type is a real^(4,1)multivector. The constraint relationship includes a joint being on a connecting rod (i.e., a point being on a line), a connecting rod being on an auxiliary plane on which a joint is located (i.e., a line being on a plane), and so on.

The following is a geometric pure rotation model abstracted from the rotation motion of the basic components of a robot:

$$\begin{cases} R = \cos\left(\frac{\phi}{2}\right) - L\sin\left(\frac{\phi}{2}\right) \\ o_{rotated} = Ro\tilde{R} \end{cases}$$

The above model can be formalized in HOL-Light, specifically as follows:

|-rotation_CGA $t1$=cos($t$/&2)% $m$basis{ }-1*(sin($t$/&2)% $m$basis{ }

|-pure_rotationed_CGA$x$ $t1$=(rotation_CGA$t1$)*$x$*(reversion(rotation_CGA $t1$))

The model uses a geometric product to realize a rotation transformation of a geometry. R is a rotation operator in conformal geometric algebra. $\tilde{R}$ is a reversion of R, L represents a rotation axis, $\phi$ is a rotation angle, o represents the expression of the geometry before rotation, and $o_{rotated}$ represents the expression of the geometry after rotation. The input variables t, l of the function rotation_CGA respectively represent a rotation angle and a rotation axis of the revolute. This function realizes the function of the rotation operator. The input variables x, t, l of the function pure_rotationed_CGA represent the geometry, rotation angle, and rotation axis. The return value of this function is a geometric representation after rotation, wherein the function reversion represents the reversion.

The following geometric pure translation model is abstracted from the translation motion of the basic components of a robot:

$$\begin{cases} T = 1 = \frac{1}{2}te_\infty \\ o_{translated} = To\tilde{T} \end{cases}$$

The above model can be formalized in HOL-Light, specifically as follows:

|-Translation_CGA $t$=$m$basis{ }-(&1/&2)% ($t$*null_inf)

|-pure_translationed_CGA$x$ $t$=(Translation_CGA_$t$)*$x$*(reversion(Translation_CGA$t$))

The model uses a geometric product to realize a geometric translation transformation. T is a translation operator in conformal geometric algebra. $\tilde{T}$ is a reversion of T, wherein $t=t_1 e_1 + t_2 e_2 + t_3 e_3$ is a translation vector, representing the direction and length of the translation, $t_1$, $t_2$, $t_3$ are coefficients, o is the expression of the geometry before translation, $o_{translated}$ is the expression of the geometry after translation, and the input variable t of the function Translation_CGA is a translation vector, representing the direction and length of the translation. This function realizes the function of the translation operator. The input variables x, t of the function pure_translationed_CGA represent the geometry and translation vector, and the return value of the function is a geometric representation after translation.

The geometric rigid body motion model is abstracted from the motion of an end of a robot joint reaching a desired position:

$$\begin{cases} M = RT \\ o_{rigid\_body\_motion} = Mo\tilde{M} \end{cases}$$

The above model can be formalized in HOL-Light, specifically as follows:

|-motor_CGA $a$ $l$ $t$=rotation_CGA $a$ $l$*Translation_CGA $t$

|-rigid_body_motion $x$ $a$ $l$ $t$=(motor_CGA $a$ $l$ $t$)*$x$*(reversion(motor_CGA $a$ $l$ $t$))

This model uses a geometric product to realize the geometric rigid body transformation, wherein R and T are a rotation operator and a translation operator respectively, and the two are connected by a geometric product operation. M is a Motor operator, $\tilde{M}$ is a reversion of M, o is an expression of the geometry before the rigid body motion, and $o_{rigid\_body\_motion}$ represents an expression of the geometry after the rigid body motion. The input variables x, a, l, t of the function motor_CGA respectively represent a geometry, a rotation angle, a rotation axis, and a translation vector. This function realizes the function of the motor operator. The return value of the function rigid_body_motion is a geometric representation after the rigid body motion. This representation indicates that the geometry is translated first and then rotated, but the motor operator has associativity, and the rotation operator and the translation operator are interchangeable.

The distance model between geometries is abstracted from the metric relationship of the basic components of a robot:

$$A \cdot B = -\frac{1}{2}\|a-b\|^2$$

|-∀a b.(point_CGA a)inner(point_CGA b)=(--(&1/
&2)*dist(a,b)pow 2)% mbasis{ } wherein a and b represent any two points in the three-dimensional Euclidean space, and A and B are expressions of a point a and a point b in a conformal space respectively. The above model is an expression of a point-to-point distance in conformal geometric algebra, wherein dist(a,b) represents the distance between two points, which can be represented by the inner product of geometric algebra. A point-to-line distance, a point-to-sphere distance, and a sphere-to-sphere distance also have specific expressions in conformal geometric algebra, which can be used for specific computations in robot problems.

The geometric angle model is abstracted from an angle of the basic components of a robot:

$$\theta = L(o_1, o_2) = \arccos \frac{o_1^* \cdot o_2^*}{|o_1^*||o_2^*|}$$

The above model can be formalized in HOL-Light, specifically as follows:

|-∀o₁ o₂.vector_angles_CGA o₁ o₂=acs((o₁ inner
o₂)$${ }/(mult_norm o₁*mult_norm o₂))

The geometric angle model abstracted from an angle of the basic components of the robot is used to compute an angle θ of the basic components of the robot.

This model is an expression of the geometric angle θ in conformal geometric algebra. The input variables $o_1$ and $o_2$ of the function vector_angles_CGA respectively represent the geometries between which an angle is to be computed, which can be lines or planes. The data type is a real^(4,1) multivector. The function inner represents the left contraction product operation in geometric algebra, $${ } represents the size of the 0-grade subspace, i.e. scalar, and the function mult_norm is used to perform a modulo operation for multivectors. This model can be used to compute an angle between the basic components of the robot, with $o_1^*$, $o_2^*$ representing duals of $o_1$ and $o_2$ respectively, wherein $o_1^*=-o_1$, $o_2^*=o_2$.

Specifically, in an implementation of the present application, performing formal modeling for a motion process of a robot based on the established geometric model can include:

computing a first target circle where the end of the robot gripper is located based on the established geometric model in a formal way; computing a second target circle where the robot gripper is located based on the established geometric model and feature points on the robot gripper in a formal way; computing a translation operator of the robot gripper according to the first target circle and the second target circle in a formal way; computing a rotation operator of the grasping of an object by the robot gripper according to the first target circle and the second target circle in a formal way; computing a new target position of the robot gripper according to the translation operator and the rotation operator in a formal way; realizing the formal modeling for the motion process of the robot.

The motion process of the robot arm can include various forms. In order to more clearly explain the embodiment of the present application, the grasping of an object by the robot is taken as an example to describe the method for formally analyzing the motion planning of the robot arm based on the conformal geometric algebra provided by the embodiment of the present application, given in detail as follows.

Preferably, the specific robot in the method is an n-degree-of-freedom serial robot arm with a T-shaped robot gripper at the end of it.

The specific motion planning of a robot in the method is a motion planning process of the grasping of an object by the robot arm.

The attribute of the motion process to be verified in the method is that the robot gripper successfully and firmly grasps the Object.

Figure 2:
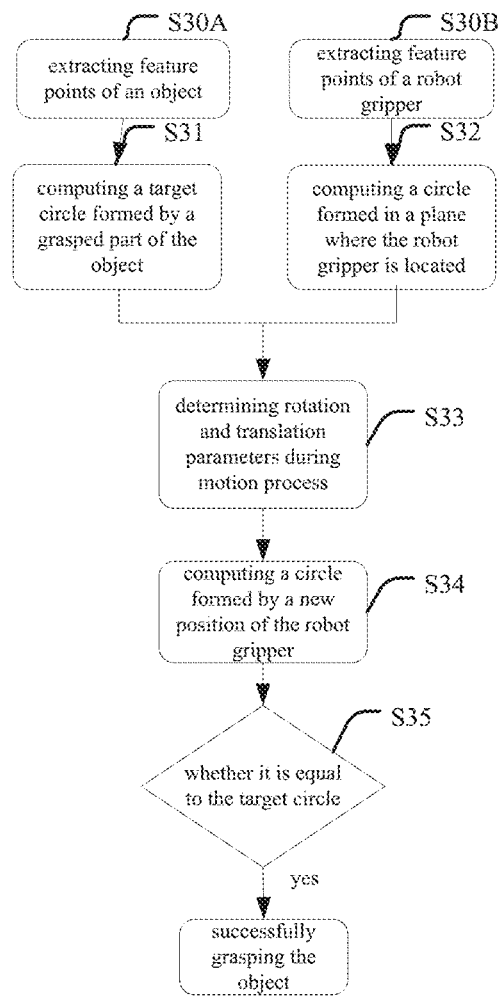
FIG. 2 is a flowchart of the verification of an algorithm of the grasping of an object by a robot in the present application.

FIG. 2 shows a flowchart of the formal modeling of a motion planning process concerning the grasping of an object by a robot in the present application. As shown in FIG. 2, the following steps are included.

Step 30: extracting feature points of an object and a robot gripper, respectively.

It corresponds to S30A and S30B in FIG. 2.

Step 31: computing a target circle where a grasped position of the object is located.

It corresponds to S31 in FIG. 2.

Figure 3:
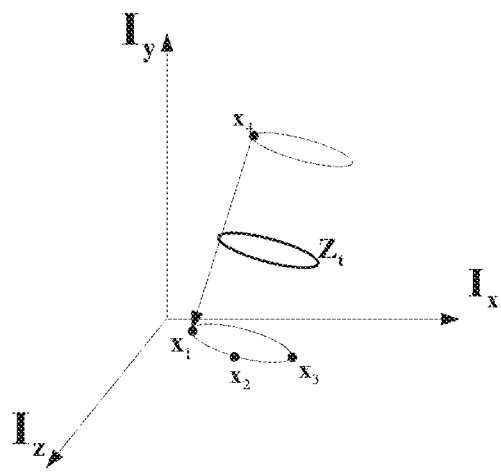
FIG. 3 is a schematic diagram of the computing of a target circle $Z_t$ in the present application.
Figure 4:
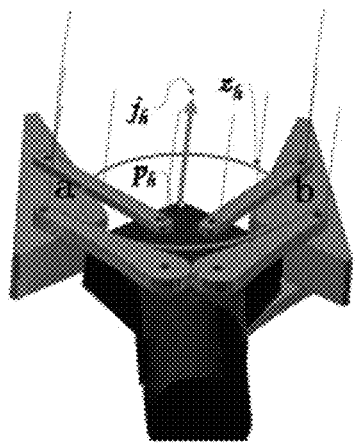
FIG. 4 is a schematic diagram of the computing of a robot gripper circle $Z_h$ in the present application.

As shown in FIGS. 3 and 4, the position and orientation of the object are obtained by four feature points (x1, x2, x3, x4) at the edge of the object, wherein x1, x2, and x3 are any three points on the bottom edge of the object, and x4 is any point on the top edge of the object. A reference circle $Z^*_b$ formed by three points on the bottom of the object can be obtained by a direct expression of the circle:

$$Z^*_b = x_1 \wedge x_2 \wedge x_3$$

A plane $\pi_b$, where the reference circle $Z^*_b$ on the bottom of the object is located is:

$$\pi_b = (Z^*_b \wedge e_\infty)I_c$$

wherein Ic is a pseudo-scalar of conformal geometric algebra, a dual operation can be realized by the pseudo-scalar, and the dual operation can realize a mutual transformation of two expressions of a geometry.

Since it is convenient to set the grasped position of the object in a middle part, the target circle $Z_t$ should be a circle after the reference circle on the bottom is translated by a length of $$\frac{1}{2}(\pi_b \cdot x_4)$$

in a direction $-\pi_b$. The corresponding translation operator T would then be:

$$T = 1 + \frac{1}{4}(\pi_b \cdot x_4)\pi_b e_\infty$$

The target circle $Z_t$ formed by the grasped part of the object would then be:

$$Z_t = TZ^*_b\tilde{T}$$

$\tilde{T}$ is a reversion of T.

Wherein, $Z^*_b = -Z_b$, and the above computation process is formalized in HOL-Light as follows:

let dual_circle_zb x1 x2 x3=(circle_direct_CGA (point_CGA x1)(point_CGA x2)(point_CGA x3))

let plane_b x1 x2 x3=((dual_circle_zb x1 x2 x3) outer null_int)*pseudo let circle_zt x1 x2 x3 x4=pure_translationed_CGA (--DUAL (dual_circle_zb x1 x2 x3)) (--(&1/&2)%((plane_b x1 x2 x3)inner(point_CGA x4)))

wherein the reference circle $Z^*_b$ at the bottom of the object calls the direct function circle_direct_CGA of the circle, and x1, x2, x3, x4 represent four feature points of the object. The HOL types are all real^3, representing a three-dimensional Euclidean vector. Feature points are embedded from the three-dimensional Euclidean space into the five-dimensional conformal space by the function point_CGA. The target circle formed by the grasped part of the object is realized by the pure translation function pure_translationed_CGA.

It should be noted that the target circle computed in this step can be understood as the first target circle above, because an end of a robot gripper generally contacts with an object when the robot gripper grasps the object.

Step 32: computing a circle where the robot gripper is located.

It corresponds to S32 in FIG. 2.

Figure 5:
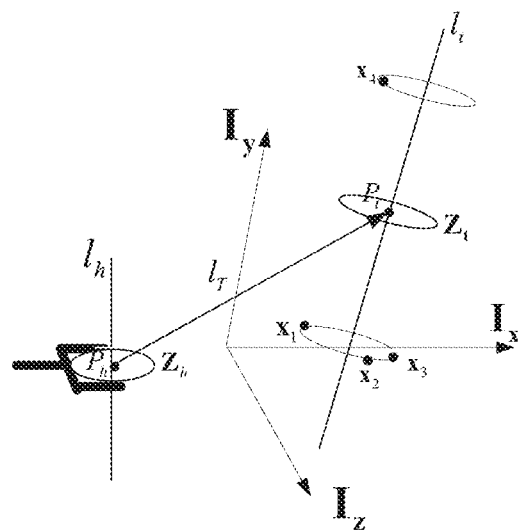
FIG. 5 is a schematic diagram of the solving of a rotation operator and a translation operator in the present application.

As shown in FIG. 5, given that a center $P_h$, a radius $\rho$ of the circle where the robot gripper is located and two feature points a, b on the robot gripper are known, a position of the circle where the robot gripper is located can be computed. First, a position of a sphere where the robot gripper is located is constructed, and a standard expression of the sphere is used to obtain the following:

$$S_h = P_h - \frac{1}{2}\rho^2 e_\infty$$

Then, a plane $\pi^*_h$ where the robot gripper is located is computed through the center $P_h$ and two feature points a, b on the robot gripper:

$$\pi^*_h = P_h \wedge a \wedge b \wedge e_\infty$$

The circle where the robot gripper is located is obtained by an intersection of the sphere $S_h$ and the plane $\pi^*_h$ where the robot gripper is located:

$$Z_h = S_h \wedge \pi^*_h$$

The above computation process is formalized in HOL-Light as follows:

let sphere_Sh ph r=sphere_CGA ph r
let dual_plane_pih ph a b=plane_direct_CGA (point_CGA ph)(point_CGA a)(point_CGA b)
let circle_zh ph r a b=(sphere_Sh ph r)outer(--DUAL (dual_plane_pih ph a b))

An auxiliary sphere $S_h$ is realized by calling a standard expression function sphere_CGA of the sphere, with (ph: real^3) and (r: real) respectively representing the center $P_h$ and the radius r of the auxiliary sphere. An auxiliary plane $\pi^*_h$, where the robot gripper is located, is realized by calling the direct expression function plane_direct_CGA of the plane, with (a: real^3) and (b: real^3) respectively representing two points on the robot gripper. A dual operator uses the function DUAL.

Step 33a: computing a translation operator of the grasping of an object by the robot gripper, where the translation operator includes a translation axis and a translation length.

It corresponds to S33 in FIG. 2.

It is known that the length of translation should be a distance between the center of the target circle $Z_t$ and the center of the circle $Z_h$ where the robot gripper is located, and that the translation axis is a straight line passing through two centers. First, the center of the target circle $Z_t$ is computed:

$$P_t = Z_t e_\infty Z_t$$

Since the translation axis is determined by two centers, the translation axis $l^*_T$ can be computed by a direct expression:

$$l^*_T = P_h \wedge P_t \wedge e_\infty$$

Accordingly, the length of translation is d:

$$d = |l^*_T| = \text{dist}(P_h, P_t)$$

The above computation process is formalized in HOL-Light:

let center_point_pt x1 x2 x3 x4=(circle_zt x1 x2 x3 x4)*null_inf*(circle_zt x1 x2 x3 x4)
let dual_translation_axis ph x1 x2 x3 x4=line_direct_CGA (point_CGA ph) (center_point_pt x1 x2 x3 x4)
let distance ph x1 x2 x3 x4=--sqrt(&2*((point_CGA ph)inner(center_point_pt x1 x2 x3 x4))$$ { })

Step 33b: computing a rotation operator of the grasping of an object by the robot gripper, with the rotation operator including a rotation axis and a rotation angle.

It corresponds to S33 in FIG. 2.

The rotation axis of the grasping of an object by the robot gripper meets a few constraints:

1. the rotation axis passes through the center $P_h$ of the circle where the robot gripper is located;
2. the rotation axis is on a plane defined by axes of the two circles.

Therefore, two axes $l^*_h$ and $l^*_t$ of the target circle $Z_t$ and the circle $Z_h$, where the robot gripper is located, are computed first:

$$l^*_h = Z_h \wedge e_\infty$$

$$l^*_t = Z_t \wedge e_\infty$$

A plane $\pi^*_{th}$ defined by the two axes is:

$$\pi^*_{th} = l^*_t \wedge (l^*_h(e_0 \wedge e_\infty))$$

Then, the rotation axis is computed as follows:

$$l^*_r = P_h \wedge \pi_{th} \wedge e_\infty, \pi_{th} = -\pi^*_{th}$$

The rotation angle is known as an angle between the two axes; thus, the angle formula is used to obtain:

$$\theta = \arccos \frac{l^*_t \cdot l^*_h}{|l^*_t||l^*_h|}$$

The above computation process is formalized in HOL-Light as follows:

let dual_lh ph r a b=(circle_zh ph r a b) outer null_inf
let dual_lt x1 x2 x3 x4=(circle_zt x1 x2 x3 x4) outer null_inf
let dual_plane_th x1 x2 x3 x4 ph r a b=(dual_lt x1 x2 x3 x4)outer((dual_lh ph r a b)*(null_zero outer null_inf))
let dual_rotation_axis x1 x2 x3 x4 ph r a b=(point_CGA ph)outer(--DUAL(dual_plane_th x1 x2 x3 x4 ph r a b))outer null_inf
let rotation angle x1 x2 x3 x4 ph r a b=vector_angles_CGA (dual_lh ph r a b) (dual_lt x1 x2 x3 x4)

Wherein the rotation angle $\theta$ is computed by using a CGA angle formula, which is realized by the function vector_angles_CGA.

Step 34: computing a new target position of the robot gripper.

It corresponds to S34 in FIG. 2.

The rotation operator R and the translation operator T of the robot gripper can be obtained by the translation axis $l^*_r$, the length of translation d, the rotation axis $l^*_r$, and the rotation angle θ computed in step 33 and step 34:

$$R = \cos\left(\frac{\theta}{2}\right) - l_r \sin\left(\frac{\theta}{2}\right), \; T = 1 - \frac{1}{2} dl_T e_\infty$$

wherein R and T are the rotation operator and the translation operator respectively, and $l_r = -l^*_r$, $l_T = -l^*_T$.

The new target position of the robot gripper can be computed by rotation and then translation. Using a rigid body operator, it can be computed as:

$$Z'_h = TRZ_h \tilde{R}\tilde{T}$$

wherein $Z'_h$ is the new target position of the robot gripper, $\tilde{R}$ is a reversion of R, and $\tilde{T}$ is a reversion of T.

Finally, the new target position of the robot gripper can be obtained, which is formalized in HOL-Light as follows:

let circle_zh_new x1 x2 x3 x4 ph r a b=pure_translationed_CGA (pure_rotationed_CGA (circle_zh ph r a b)(rotation_angle x1 x2 x3 x4 ph r a b) (--DUAL (dual_rotation_axis x1 x2 x3 x4 ph r a b)))

((distance ph r a b x1 x2 x3 x4)%(--DUAL(dual_translation_axis ph r a b x1 x2 x3 x4)))

Since the new target position of the robot gripper is obtained by first rotation and then translation, a circle $Z_h$ constructed by the robot gripper plane is first rotated by the pure rotation function pure_rotationed_CGA. The input variables of this function are the rotated geometry $Z_h$, the rotation angle θ, and the rotation axis, i.e., (circle_zh ph r a b), (rotation_angle x1 x2 x3 x4 ph r a b), and (--DUAL (dual_rotation axis x1 x2 x3 x4 ph r a b)). After the rotation, a translational motion is then performed for the circle $RZ_h\tilde{R}$ through the pure translation function pure_translationed_CGAction; the input variables of this function are the rotated geometry $RZ_h\tilde{R}$, and a translation vector $dl_T$.

The main contents of the above code involve CGA geometric representation, the features of distance between the geometries, and the formalization of the geometric motion transformation. The robot gripper circle $Z_h$ approaches the target circle $Z_t$ step by step where a position of the object is located. Finally, the robot gripper successfully and firmly grasps the object, which must meet a certain geometric constraint relationship. In the above algorithm, the constraint relationship is that the new position of the circle $Z_h$, where the robot gripper plane is located, should coincide with the position of the target circle $Z_t$, where the object is located, that is, equality should be met for the expressions in CGA. A goal can be established in HOL-Light to verify this geometric constraint relationship:

goal: • x1 x2 x3 x4 ph r a b. circle_zh_new x1 x2 x3 x4 ph r a b=circle_zt x1 x2 x3 x4

It should be noted that the "object" mentioned in the above description can be understood as "an object that is grasped."

In addition, after a new target position is computed in this step, a circle formed by the new target position needs to be computed and whether the computed circle is equal to the target circle computed in the above S31 is determined. If they are equal, this is an indication that the robot gripper is successfully grasping the object. This determination corresponds to S35 in FIG. 2.

The methods for performing the formal modeling and verification of the motion planning of robots, based on CGA in the solutions provided in the above embodiments, can be loaded and used in HOL-Light. One of the biggest difficulties encountered in the process is that the theorem proving technique requires a great deal of man-machine interaction, a great deal of work, and a great deal of time. The process of modeling emphasizes a user's familiarity with the theoretical knowledge of CGA, and the process of verification requires rigorous thinking and some experience with logical reasoning.

In addition, unlike the traditional method, in the technical solutions provided in the above embodiment, after a geometric relationship logic model is obtained by performing the modeling in a formal way, a motion logic relationship corresponding to a constraint or attribute of a motion process to be verified is obtained according to the logical model of geometric relations, and whether the above motion logic relationship is correct is verified. The above method is accurate and complete for the nature of the verification, since correctness is verified using mathematical methods. In addition, CGA can be used to perform the modeling and processing on geometric elements such as points, lines, planes, circles, and spheres, and the rotation and translation of these geometric elements in a unified manner. It offers great advantages for dealing with problems of robot kinematics and motion planning, and can improve dimensions for solving problems, thus simplifying the coupling in robot computations, and thus reducing the complexity of the computations. In view of the above two aspects, when the technical solutions provided by the above embodiments are applied to analyze the motion planning of a robotic arm, the complexity of the computations can be reduced while the verification accuracy is improved. Thus, the respective advantages of CGA and of formal methods are fully exerted, and the combination of both mutually strengthens their respective advantages.

Corresponding to the above method for formally analyzing the motion planning of a robotic arm based on conformal geometric algebra, an embodiment of the present application further provides a system for formally analyzing the motion planning of a robotic arm based on conformal geometric algebra.

Specifically, the system includes:

a parameter determining module, configured for determining the specific structural parameters and motion planning parameters of a robot;

a module for the establishing of robot basic geometric logical models, configured for establishing a corresponding geometric model for the basic components and motion planning constraints of the robot according to the specific structural parameters and the motion planning parameters based on a conformal geometric algebra theory, wherein the established geometric model is described in a higher-order logic language;

a module for the establishing of a logical model of geometric relations involved in the motion process of the robot, configured for performing formal modeling for a motion process of the robot based on the established geometric model, to obtain a logical model of geometric relations involved in the motion process of the robot;

a module for the construction of logical propositions, configured for obtaining a motion logic relationship corresponding to a constraint or attribute of a motion process to be verified of the robot, using the logical model of geometric relation;

a verification module, configured for verifying whether the motion logic relationship is correct; if the motion logic relationship is correct, this indicates that the logical model of geometric relations meets the constraint of the motion process to be verified or has the attribute of the motion process to be verified, or if the motion logic relationship is not correct, this indicates that the logical model of geometric relations does not meet the constraint of the motion process to be verified or does not have the attribute of the motion process to be verified.

In addition, unlike the traditional method, in the technical solution provided in the embodiment, after a logical model of geometric relations is obtained by performing the modeling in a formal way, a motion logic relationship corresponding to a constraint or attribute of a motion process to be verified is obtained according to the logical model of geometric relations, and whether the above motion logic relationship is correct is verified. The above method is accurate and complete for the nature of the verification, since the correctness is verified using mathematical methods. In addition, CGA can be used to perform the modeling and processing on geometric elements such as points, lines, planes, circles, and spheres, and the rotation and translation of these geometric elements in a unified manner. It offers great advantages for dealing with problems of robot kinematics and motion planning, and can improve dimensions for solving problems, thus simplifying the coupling in robot computation, and thus reducing the complexity of the computations. In view of the above two aspects, when the technical solutions provided by the above embodiments are applied to analyze the motion planning of a robotic arm, the complexity of the computations can be reduced while the verification accuracy is improved. Thus, the respective advantages of CGA and a formal way are fully exerted, and the combination of both even mutually strengthens their own advantages.

Correspondingly, the present application further provides a storage medium, which is configured to store executable program code, and the executable program code is executed to perform the method for formally analyzing the motion planning of a robotic arm based on conformal geometric algebra. The method for formally analyzing the motion planning of a robotic arm based on conformal geometric algebra in the present application includes:

determining the specific structural parameters and motion planning parameters of a robot;

establishing a corresponding geometric model for the basic components and motion planning constraints of the robot according to the specific structural parameters and the motion planning parameters based on a conformal geometric algebra theory, wherein the established geometric model is described in a higher-order logic language;

performing formal modeling for a motion process of the robot based on the established geometric model, to obtain a logical model of the geometric relations involved in the motion process of a robot;

obtaining a motion logic relationship corresponding to a constraint or attribute of a motion process to be verified of the robot, using the logical model of geometric relations;

verifying whether the motion logic relationship is correct; if the motion logic relationship is correct, this indicates that the logical model of geometric relations meets the constraint of the motion process to be verified or has the attribute of the motion process to be verified, or if the motion logic relationship is not correct, this indicates that the logical model of geometric relations does not meet the constraint of the motion process to be verified or does not have the attribute of the motion process to be verified.

The program code stored in the storage medium provided in the present embodiment is performed according to the method: after obtaining a logical model of geometric relations by performing the modeling in a formal way, obtaining a motion logic relationship corresponding to a constraint or attribute of a motion process to be verified according to the logical model of geometric relations, and verifying whether the above motion logic relationship is correct. The above method is accurate and complete for the nature of the verification, since the correctness is verified using mathematical methods. In addition, CGA can be used to perform the modeling and processing on geometric elements such as points, lines, planes, circles, and spheres, rotation and translation of these geometric elements in a unified manner. It offers great advantages in dealing with problems of robot kinematics and motion planning, and can improve dimensions for solving problems, thus simplifying the coupling in robot computations, and thus reducing the complexity of the computations. In view of the above two aspects, when the technical solutions provided by the above embodiments are applied to analyze the motion planning of a robotic arm, the complexity of the computations can be reduced while the verification accuracy is improved. Thus, the respective advantages of CGA and of formal methods are fully exerted, and the combination of both mutually strengthens their own advantages.

Correspondingly, the present application further provides an application program, which is executed to perform the method for formally analyzing the motion planning of a robotic arm based on conformal geometric algebra. The method for formally analyzing the motion planning of a robotic arm based on conformal geometric algebra in the present application includes:

determining the specific structural parameters and motion planning parameters of a robot;

establishing a corresponding geometric model for the basic components and motion planning constraints of the robot according to the specific structural parameters and the motion planning parameters based on a conformal geometric algebra theory, wherein the established geometric model is described in a higher-order logic language;

performing formal modeling for a motion process of the robot based on the established geometric model, to obtain a logical model of geometric relations involved in the motion process of the robot;

obtaining a motion logic relationship corresponding to a constraint or attribute of a motion process to be verified of the robot, using the logical model of geometric relations;

verifying whether the motion logic relationship is correct; if the motion logic relationship is correct, this indicates that the logical model of geometric relations meets the constraint of the motion process to be verified or has the attribute of the motion process to be verified, or if the motion logic relationship is not correct, this indicates that the logical model of geometric relations does not meet the constraint of the motion process to be verified or does not have the attribute of the motion process to be verified.

The application program provided in the present embodiment is performed according to the method: after obtaining a geometric relationship logic model by performing the modeling in a formal way, obtaining a motion logic relationship corresponding to a constraint or attribute of a motion process to be verified according to the geometric relationship logic model, and verifying whether the above motion logic relationship is correct. The above method is accurate and complete for the nature of the verification, since the correctness is verified using mathematical methods. In addition, CGA can be used to perform the modeling and processing on geometric elements such as points, lines, planes, circles, and spheres, and the rotation and translation of these geometric elements in a unified manner. It offers great advantages for dealing with problems of robot kinematics and motion planning, and can improve dimensions for solving problems, thus simplifying the coupling in robot computations, and thus reducing the complexity of the computations. In view of the above two aspects, when the technical solutions provided by the above embodiments are applied to analyze the motion planning of a robotic arm, the complexity of the computations can be reduced while the verification accuracy is improved. Thus, the respective advantages of CGA and a formal way are fully exerted, and the combination of both even mutually strengthens their own advantages.

Correspondingly, the present application also provides an electronic device, which includes:

a processor, a memory, a communication interface, and a bus, wherein the processor, the memory, and the communication interface are connected and communicate with each other through the bus, the memory stores executable program code, the processor executes a program corresponding to the executable program code by reading the executable program code stored in the memory, to perform the method for formally analyzing the motion planning of a robotic arm based on conformal geometric algebra. The method for formally analyzing the motion planning of a robotic arm based on conformal geometric algebra in the present application includes:

determining the specific structural parameters and motion planning parameters of a robot;

establishing a corresponding geometric model for the basic components and motion planning constraints of the robot according to the specific structural parameters and the motion planning parameters based on a conformal geometric algebra theory, wherein the established geometric model is described in a higher-order logic language;

performing formal modeling for a motion process of the robot based on the established geometric model, to obtain a logical model of geometric relations involved in the motion process of the robot;

obtaining a motion logic relationship corresponding to a constraint or attribute of a motion process to be verified of the robot, using the logical model of geometric relations;

verifying whether the motion logic relationship is correct; if the motion logic relationship is correct, this indicates that the logical model of geometric relations meets the constraint of the motion process to be verified or has the attribute of the motion process to be verified, or if the motion logic relationship is not correct, this indicates that the logical model of geometric relations does not meet the constraint of the motion process to be verified or does not have the attribute of the motion process to be verified.

In the electronic device provided in the embodiment, after a logical model of geometric relations is obtained by performing the modeling in a formal way, a motion logic relationship corresponding to a constraint or attribute of a motion process to be verified is obtained according to the logical model of geometric relations, and whether the above motion logic relationship is correct is verified. The above method is accurate and complete for the nature of the verification, since the correctness is verified using mathematical methods. In addition, CGA can be used to perform the modeling and processing on geometric elements such as points, lines, planes, circles, and spheres, and the rotation and translation of these geometric elements in a unified manner. It offers great advantages in dealing with problems of robot kinematics and motion planning, and can improve dimensions for solving problems, thus simplifying the coupling in robot computation, and thus reducing the computation complexity. In view of the above two aspects, when the technical solutions provided by the above embodiments are applied to analyze the motion planning of a robotic arm, the complexity of the computations can be reduced while the verification accuracy is improved. Thus, the respective advantages of CGA, and a formal way are fully exerted, and the combination of both even mutually strengthens their own advantages.

The embodiments of a system, a storage medium, an application program and an electronic device are described briefly since they are substantially similar to the embodiment of the method. Related contents can refer to the part that describes the embodiment of the method.

It should be noted that the relationship terms used here, such as "first," "second," and the like are only used to distinguish one entity or operation from another entity or operation, but do not necessarily require or imply that there is actual relationship or order between these entities or operations. Moreover, the terms "include," "comprise," or any variants thereof are intended to cover a non-exclusive inclusion, such that processes, methods, articles, or devices, including a series of elements, include not only those elements that have been listed, but also other elements that have not specifically been listed or the elements intrinsic to these processes, methods, articles, or devices. Without further limitations, elements limited by the wording "comprise(s) a/an . . . " do not exclude additional identical elements in the processes, methods, articles, or devices, including the listed elements.

All of the embodiments in the description are described in a correlated manner, and identical or similar parts in various embodiments can refer to one another. In addition, the description for each embodiment focuses on the differences from other embodiments. In particular, the embodiment of the system is described briefly, since it is substantially similar to the embodiment of the method, and the related contents can refer to the description of the embodiment of the method.

It can be understood by a person skilled in the art that all or a part of steps in the implementations of the above method can be accomplished by instructing related hardware through programs, which can be stored in a computer-readable storage medium, such as in ROM/RAM, a disk, an optical disk, and so on.

The embodiments described above are simply preferable embodiments of the present application, and are not intended to limit the scope of protection of the present application. Any modifications, alternatives, improvements, or the like within the spirit and principle of the present application shall be included within the scope of protection of the present application.

The invention claimed is:

1. A method for formally analyzing a motion planning of a robotic arm based on conformal geometric algebra, which is performed by a computing system comprising a processor, comprising:

determining specific structural parameters and motion planning parameters of a robot;

establishing a corresponding geometric model for basic components and motion planning constraints of the robot according to the specific structural parameters and the motion planning parameters based on a conformal geometric algebra theory, wherein the established geometric model is described in a higher-order logic language;

performing formal modeling for a motion process of the robot based on the established geometric model, to obtain a logical model of geometric relations involved in the motion process of the robot;

obtaining a motion logic relationship corresponding to a constraint or attribute of a motion process to be verified of the robot, using the logical model of geometric relations;

verifying whether the motion logic relationship is correct; when the motion logic relationship is correct, this indicates that the logical model of geometric relations meets the constraint of the motion process to be verified or has an attribute of the motion process to be verified, or when the motion logic relationship is not correct, this indicates that the logical model of geometric relations does not meet the constraint of the motion process to be verified or does not have the attribute of the motion process to be verified; and updating the motion planning of a robotic arm when the motion logic relationship is not correct.

2. The method of claim 1, wherein the established geometric model comprises a point model abstracted from a robot joint, a sphere model abstracted from a reachable range of an end of a robot joint, a plane model abstracted from an auxiliary plane on which a robot joint is located, and a line model constructed by connecting robot joint points, a geometric intersection model abstracted from constraint relationship of the basic components of the robot, a geometric pure rotation model abstracted from rotation motion of the basic components of the robot, a geometric pure translation model abstracted from translation motion of the basic components of the robot, a geometric rigid body motion model abstracted from reaching of a desired position by an end of a robot joint, a distance model between geometries abstracted from the metric relationship of the basic components of the robot, and a geometric angle model abstracted from an angle of the basic components of the robot.

3. The method of claim 2, wherein the point model abstracted from a robot joint is represented as follows:

$$S = s + \frac{1}{2}s^2 e_\infty + e_0$$

$$e_0 = \frac{1}{2}(e_- - e_+)$$

$$e_\infty = e_- + e_+$$

wherein $s = s_1 e_1 + s_2 e_2 + s_3 e_3$ represents a point in a three-dimensional Euclidean space, $e_1$, $e_2$ and $e_3$ are unit orthonormal bases in the three-dimensional Euclidean space, $s_1$, $s_2$, and $s_3$ are coefficients, S is an expression of a point s mapped from the Euclidean space into a conformal space, $e_0$ represents an origin point, $e_\infty$ represents a point at infinity, and $e_+$, $e_-$ are respectively the fourth base vector and the fifth base vector in the conformal geometric space.

4. The method of claim 2, wherein the sphere model abstracted from a reachable range of an end of a robot joint is used to abstract the reachable range of the end of the robot joint into a sphere S, whose center is the joint and whose radius is a connecting rod between the joint and another joint, which is represented as:

$$S = P - \frac{1}{2}r^2 e_\infty$$

wherein P and r respectively represent the center and the radius, and $e_\infty$ represents a point at infinity.

5. The method of claim 2, wherein the plane model abstracted from an auxiliary plane on which a robot joint is located is used to abstract the auxiliary plane on which the robot joint is located into a plane $\pi$, which is represented as:

$$\pi = n + d e_\infty$$

wherein n and d respectively represent a normal vector of the auxiliary plane and the distance from the auxiliary plane to the origin point, and $e_\infty$ represents a point at infinity.

6. The method of claim 2, wherein the line model constructed by connecting robot joint points is used to abstract a connecting rod between two joints into a line L*, which is represented as:

$$L^* = A \wedge B \wedge e_\infty$$

wherein A and B respectively represent points represented by the two joints, and $e_\infty$ represents a point at infinity.

7. The method of claim 2, wherein the geometric intersection model o abstracted from the constraint relationship of the basic components of the robot is represented as:

$$o = o_1 \wedge o_2 \wedge \ldots o_n$$

wherein of represents a geometry representing the ith basic component of the robot, i=1, 2, . . . , n.

8. The method of claim 2, wherein the geometric pure rotation model abstracted from the rotation motion of the basic components of the robot is represented as:

$$\begin{cases} R = \cos\left(\frac{\phi}{2}\right) - L\sin\left(\frac{\phi}{2}\right) \\ o_{rotated} = Ro\tilde{R} \end{cases}$$

wherein R is a rotation operator in the conformal geometric algebra, $\tilde{R}$ is a reversion of R, L is a rotation axis, $\phi$ is a rotation angle, o is an expression of the geometry before rotation, and $o_{rotated}$ is an expression of the geometry after rotation.

9. The method of claim 2, wherein the geometric pure translation model abstracted from the translation motion of the basic components of the robot is represented as:

$$\begin{cases} T = 1 - \frac{1}{2}t e_\infty \\ o_{translated} = To\tilde{T} \end{cases}$$

wherein T is a translation operator in the conformal geometric algebra and $\tilde{T}$ is a reversion of T, wherein $t = t_1 e_1 + t_2 e_2 + t_3 e_3$ is a translation vector representing the direction and length of the translation, o is an expression of the geometry before translation, $o_{translated}$ is an expression of the geometry after translation, and $e\infty$ represents a point at infinity.

10. The method of claim 2, wherein the geometric rigid body motion model abstracted from the reaching of a desired position by an end of a robot joint is represented as:

$$\begin{cases} M = RT \\ o_{rigid\_body\_motion} = Mo\tilde{M} \end{cases}$$

wherein R and T are a rotation operator and a translation operator respectively, M is a Motor operator, $\tilde{M}$ is a reversion of M, o is an expression of the geometry before rigid body motion, and $o_{rigid\_body\_motion}$ is an expression of the geometry after rigid body motion.

11. The method of claim 2, wherein the distance model between geometries abstracted from the metric relationship of the basic components of the robot is represented as:

$$A \cdot B = -\frac{1}{2}\|a - b\|^2$$

wherein a, b represent any two points in the three-dimensional Euclidean space, and A, B are expressions of points a, b in a conformal space respectively.

12. The method of claim 2, wherein the geometric angle model abstracted from an angle of the basic components of the robot is used to compute an angle θ of the basic components of the robot, which is represented as:

$$\theta = \angle(o_1, o_2) = \arccos\frac{o_1^* \cdot o_2^*}{|o_1^*||o_2^*|}$$

wherein $o_1$, $o_2$ respectively represent geometries between which an angle is to be computed, and $o_1^*$, $o_2^*$ respectively represent duals of $o_1$ and $o_2$, wherein $o_1^* = -o_1$, $o_2^* = o_2$.

13. The method of claim 1, wherein performing formal modeling for a motion process of the robot based on the established geometric model comprises:
   computing a first target circle where an end of a robot gripper is located based on the established geometric model in a formal way;
   computing a second target circle where the robot gripper is located based on the established geometric model and feature points on the robot gripper in a formal way;
   computing a translation operator of the robot gripper according to the first target circle and the second target circle in a formal way;
   computing a rotation operator of grasping of an object by the robot gripper according to the first target circle and the second target circle in a formal way;
   computing a new target position of the robot gripper according to the translation operator and the rotation operator in a formal way, to realize the formal modeling of the motion process of the robot.

14. The method of claim 13, the motion process of the robot, comprises: a motion process of the grasping of an object by the robot;
   wherein the first target circle is computed as follows:
      a position and orientation of the object that is grasped are obtained by four feature points x1, x2, x3, and x4 at an edge of the object that is grasped, wherein x1, x2, and x3 are any three points on a bottom edge of the object that is grasped and x4 is any point on a top edge of the object that is grasped; and a reference circle $Z_b^*$ formed by three points on the bottom of the object that is grasped is obtained by the following direct expression of the circle:

$$Z_b^* = x_1 \wedge x_2 \wedge x_3;$$

a plane $\pi_b$, where the reference circle $Z_b^*$ on the bottom of the object that is grasped is located, is obtained as follows:

$$\pi_b = (Z_b^* \wedge e_\infty) I_c;$$

wherein $I_c$ is a pseudo-scalar of the conformal geometric algebra, and $e_\infty$ represents a point at infinity;

a third target circle $Z_t$, where a grasped position of the object that is grasped is located, is a circle after the reference circle is translated by a length of $$\frac{1}{2}(\pi_b \cdot x_4)$$

in a direction of $-\pi_b$; then, the corresponding translation operator T is:

$$T = 1 + \frac{1}{4}(\pi_b \cdot x_4)\pi_b e_\infty;$$

the third target circle $Z_t$ computed in a formal way is:

$$Z_t = TZ_b^*\tilde{T};$$

wherein the $\tilde{T}$ is a reversion of T;
the third target circle is determined as the first target circle.

15. The method of claim 14, wherein the second target circle where the robot gripper is located is computed as follows:
   given that a center $P_h$, a radius p of the circle where the robot gripper is located, and two feature points a, b on the robot gripper are known, a position of the circle where the robot gripper is located is computed; first, a position of a sphere where the robot gripper is located is constructed, and a standard expression of the sphere is used to obtain:

$$S_h = P_h - \frac{1}{2}\rho^2 e_\infty;$$

wherein $S_h$ is the sphere where the robot gripper is located;
a plane $\pi_h^*$ where the robot gripper is located is computed according to the two feature points a, b on the robot gripper:

$$\pi_h^* = P_h \wedge a \wedge b \wedge e_\infty;$$

an intersection of the sphere $S_h$ and the plane $\pi_h^*$ where the robot gripper is located is computed in a formal way to obtain a second target circle $Z_h$, where the robot gripper is located:

$$Z_h = S_h \wedge \pi_h^*.$$

16. The method of claim 15, wherein the translation operator of the robot gripper comprises a translation axis and a translation length, which are specifically computed as follows:
first, compute the center of the first target circle $Z_t$:

$$P_t = Z_t e_\infty Z_t;$$

compute the translation axis $l_T^*$ in a formal way and a direct expression:

$$l_T^* = P_h \wedge P_t \wedge e_\infty;$$

compute a length of translation d in a formal way:

$$d = |l_T^*| = \text{dist}(P_h, P_t).$$

17. The method of claim 16, wherein the rotation operator of the robot gripper comprises a rotation axis and a rotation angle, which are specifically computed as follows:
compute two axes $l_h^*$ and $l_t^*$ of the first target circle $Z_t$ and the second target circle $Z_h$:

$$l_h^* = Z_h \wedge e_\infty, l_t^* = Z_t \wedge e_\infty;$$

the plane $\pi_{th}^*$ defined by the two axes is:

$$\pi_{th}^* = l_t^* \wedge (l_h^* (e_0 \wedge e_\infty));$$

wherein $e_0$ represents an origin point, and $e_\infty$ represents a point at infinity;
compute the rotation axis $l_r^*$ in a formal way:

$$l_r^* = P_h \wedge \pi_{th} \wedge e_\infty, \pi_{th} = -\pi_{th}^*;$$

compute the rotation angle in a formal way:

$$\theta = \arccos \frac{l_t^* \cdot l_h^*}{|l_t^*||l_h^*|}.$$

18. The method of claim 17, wherein the new target position of the robot gripper is computed as follows:
the rotation operator and the translation operator of the grasping of the object by the robot gripper are obtained by the translation axis $l_T^*$, the length of translation, the rotation axis $l_r^*$, and the rotation angle $\theta$:

$$R = \cos\left(\frac{\theta}{2}\right) - l_r \sin\left(\frac{\theta}{2}\right), T = 1 - \frac{1}{2} d l_T e_\infty;$$

wherein R and T are the rotation operator and the translation operator respectively, and $l_r = -l_r^*$, $l_T = -l_T^*$;
through a formal way, the new target position of the robot gripper is computed as follows:

$$Z_h' = TR Z_h \tilde{R} \tilde{T};$$

wherein $Z_h'$ is the new target position of the robot gripper, $\tilde{R}$ is a reversion of R, and $\tilde{T}$ is a reversion of T.

19. A system for formally analyzing a motion planning of a robotic arm based on conformal geometric algebra, the system comprising a computing system comprising a processor configured to:
determine specific structural parameters and motion planning parameters of a robot;
establish a corresponding geometric model for basic components and motion planning constraints of the robot according to the specific structural parameters and the motion planning parameters based on a conformal geometric algebra theory, wherein the established geometric model is described in a higher-order logic language;
establish a logical model of geometric relations involved in the motion process of the robot, configured for performing formal modeling for a motion process of the robot based on the established geometric model, to obtain a logical model of geometric relations involved in the motion process of the robot;
obtain a motion logic relationship corresponding to a constraint or attribute of a motion process to be verified of the robot, using the logical model of geometric relations;
verify whether the motion logic relationship is correct; when the motion logic relationship is correct, this indicates that the logical model of geometric relations meets the constraint of the motion process to be verified or has an attribute of the motion process to be verified, or when the motion logic relationship is not correct, this indicates that the logical model of geometric relations does not meet the constraint of the motion process to be verified or does not have the attribute of the motion process to be verified; and
update the motion planning of a robotic arm when the motion logic relationship is not correct.

20. An electronic device comprising:
a processor, a memory, a communication interface, and a bus,
wherein the processor, the memory, and the communication interface are connected and communicate with each other through the bus,
the memory stores an executable program code,
the processor executes a program corresponding to the executable program code by reading the executable program code stored in the memory, to perform the method for formally analyzing the motion planning of a robotic arm based on conformal geometric algebra, comprising:
determining specific structural parameters and motion planning parameters of a robot;
establishing a corresponding geometric model for basic components and motion planning constraints of the robot according to the specific structural parameters and the motion planning parameters based on a conformal geometric algebra theory, wherein the established geometric model is described in a higher-order logic language;
performing formal modeling for a motion process of the robot based on the established geometric model, to obtain a logical model of geometric relations involved in the motion process of the robot;
obtaining a motion logic relationship corresponding to a constraint or attribute of a motion process to be verified of the robot, using the logical model of geometric relations;
verifying whether the motion logic relationship is correct; when the motion logic relationship is correct, this indicates that the logical model of geometric relations meets the constraint of the motion process to be verified or has an attribute of the motion process to be verified, or when the motion logic relationship is not correct, this indicates that the logical model of geometric relations does not meet the constraint of the motion process to be verified or does not have the attribute of the motion process to be verified; and
updating the motion planning of a robotic arm when the motion logic relationship is not correct.

* * * * *